United States Patent

Kiyota

[11] Patent Number: 6,034,534
[45] Date of Patent: Mar. 7, 2000

[54] LAMINATED CONTACT PROBE FOR INSPECTION OF ULTRA-MICROSCOPIC PITCH

[76] Inventor: Shigeo Kiyota, c/o Kiyota Manufacturing Co., 32-12, Kaminakazato 2-chome, Kita-ku Tokyo, 114, Japan

[21] Appl. No.: 08/941,738

[22] Filed: Oct. 1, 1997

Related U.S. Application Data

[63] Continuation-in-part of application No. 08/651,534, May 22, 1996, abandoned.

[30] Foreign Application Priority Data

May 25, 1995 [JP] Japan ..................................... 7-149789

[51] Int. Cl.$^7$ ....................................................... G01R 1/06
[52] U.S. Cl. ............................................ 324/762; 324/754
[58] Field of Search ...................... 324/754, 761, 324/762, 765, 725; 439/482, 824; 333/245, 248

[56] References Cited

U.S. PATENT DOCUMENTS

3,611,128 10/1971 Nagata .
4,035,723 7/1977 Kvaternik .
4,045,737 8/1977 Coberly .

*Primary Examiner*—Vinh P. Nguyen
*Attorney, Agent, or Firm*—Oliff & Berridge, PLC

[57] ABSTRACT

There is provided a laminated contact probe for use in a high frequency region for inspection of an ultra-microscopic pitch of a plurality of contact probe plates. The contact probe plate is sandwiched with the ground plates with insulating material between the contact probe plate(s) and the ground plates. Each of the contact probes and the ground plates is formed with an ultra-thin plate. The contact probe has an elongated segment portion extending from the needle portion, the elongated segment portion being provided by forming a cut on the ultra-thin plate backward the needle portion, so that the needle portion is movable on an elastic basis in a direction perpendicularly intersecting to a direction of the cut.

7 Claims, 10 Drawing Sheets

LAMINATED CONTACT PROBE FOR INSPECTION OF ULTRA-MICROSCOPIC PITCH

CROSS-REFERENCE TO RELATED APPLICATION

This is a continuation-in-part application of a patent application Ser. No. 08/651,534 filed on May 22, 1996, now abandoned.

BACKGROUND OF THE INVENTION

1. Field of the Invention

The present invention relates to a laminated contact a probe for inspection of an ultra-microscopic pitch, and more particularly to a contact probe for use in a high frequency region, which probe is capable of closely examining the breaking down, short and the like of electrodes, patterns and the like of semiconductors, liquid crystals and the like, arranged at intervals of an ultra-microscopic pitch.

2. Description of the Related Art

Hitherto, there is adopted mainly a card type of contact probe for inspecting circuits such as a high-integrated circuit arranged at intervals of an ultra-microscopic pitch, an IC, a LSI and the like, in which a number of microscopic probe pins each having the bent tip are arranged in the form of an array in such a way that the probe pins come into contact with terminals of a high-integrated circuit.

With the remarkable advance of technology in the field of electronics, recently, there have been developed ultra-microscopic high-integrated circuits and the like provided with, for example, 60 $\mu$m in pitch interval. However, the conventional card type of contact probe cannot cope with the inspection of such ultra-microscopic high-integrated circuits. To inspect the high-integrated circuits and the like provided with 60 $\mu$m in pitch interval, there is a need to provide an arrangement in which the interval between the probe pin-to-pin is 60 $\mu$m or below. However, according to the conventional card type of contact probe, since the adjacent probe pins cannot be subjected to an insulating coating treatment, it is obliged to provide an arrangement such that they are spaced so as not to contact with one another. Hence, a certain degree of interval has to be ensured, and it is the limit that the interval between the probe pin-to-pin is given with 120 $\mu$m.

In order to perform an inspection for circuits of an integrated circuit arranged at intervals of a microscopic pitch, a plane-packaging device and the like for use in a high frequency region, it is necessary to provide such an arrangement that a circuit impedance is given with a desired value.

Hitherto, as a contact probe for high frequency region, there is known a coaxial probe in which a long and narrow wire-like shaped probe is centered, and a cylindrical ground is provided around the probe through a dielectric, so that the coaxial probe is shaped as a long and narrow cylinder in its entirety. Such a coaxial probe is in contact with a circuit to be measured through a connector, when the circuit is measured. Accordingly, such a type of coaxial probe is complicated in a structure and will be expensive. Further, for providing a contact probe for inspecting an integrated circuit arranged at intervals of a microscopic pitch, it involves a very difficult processing, and the mechanical strength would be reduced. Also a high frequency electrical loss will be increased. Furthermore, since the connector is interposed, there is associated with such a problem that it is difficult in regulation of the impedance.

According to the contact probe of the earlier development, in order to provide stretch properties with respect to the axis direction, there is a need to give a certain measure of strength on a tip needle portion. This causes the inductance to be increased, so that a transmission loss of the high frequency signals is increased. Interposing a coil spring makes it possible to reduce the tip needle portion. In this case, however, it is very difficult to implement a contact probe for inspection of a microscopic pitch. Further, interposing the coil spring involves such a problem that the high frequency electrical loss is increased.

In order to solve the above-mentioned problem, the applicant of the present application developed a contact probe formed with an ultra-thin plate. According to such a type of contact probe, in view of the fact that the ultra-thin plate is able to be formed with a thickness of not more than 60 $\mu$m and also an insulating coating is readily implemented, it is possible to sufficiently cope with the ultra-microscopic high-integrated circuits and the like provided with an pitch interval of not more than 60 $\mu$m.

Further, in order to provide for this type of probe characteristics of performing a circuit inspection for high frequency region, there is provided such an arrangement that an impedance can be set up to a desired value. On the other hand, the contact probe thus developed involves such a problem that the contact probe cannot cope with a large number of times of inspection, such as several hundred thousand times of inspection, since it is worse in elastic durability.

SUMMARY OF THE INVENTION

In view of the foregoing, it is therefore an object of the present invention to provide a contact probe for high frequency region capable of readily setting up an impedance to a desired property, and capable of performing a large number of times of inspection, such as several hundred thousand times of inspection, for ultra-microscopic high-integrated circuits and the like provided with, for example, 60 $\mu$m in pitch interval.

In order to attain the above-mentioned object, according to the present invention, there is provided a laminated contact probe for high frequency region for inspection of an ultra-microscopic pitch, comprising: a plurality of contact probes, wherein said contact probes and ground plates are formed with ultra-thin plates; the contact probes are sandwiched with the ground plates provided with insulating material between the contact probe(s) and the ground plates; the contact probe has an elongated segment portion extending from a needle portion, said elongated segment portion being provided by forming a cut on the ultra-thin plate backward the needle portion, so that said needle portion is movable on an elastic basis in a direction perpendicularly intersecting to a direction of the cut; and said plurality of contact probes are laminated.

According to the laminated contact probe for inspection of an ultra-microscopic pitch of the present invention as mentioned above, it is possible to form a high frequency transmission path inside the ground shield and also to readily set up a desired impedance by means of controlling a thickness of the insulation (dielectric) and a width of the probe, and further, it is possible to perform a large number of times of inspection, such as several hundred thousand times of inspection, for ultra-microscopic high-integrated circuits and the like.

According to the present invention, the contact probe is formed into a thin plate with thin ground plates. Thus, superimposing such contact probes on one another and laminating those contact probes in a line makes it possible to inspect even a high-integrated circuit arranged at intervals of an ultra-microscopic pitch, such as 40 μm. Laminating the contact probes out of alignment in a plurality of lines such as two lines, three lines permits the needle portions to be arranged in a stagger-like configuration at intervals of one half, one third of the thin plate. Thus, it is possible to inspect even a high-integrated circuit arranged at intervals of an ultra-microscopic pitch, such as ones of thickness of one half, and one third of the thin plate of the contact probe.

While the needle tip portions of the contact probes according to the present invention are not subjected to an insulating coating treatment, there is no possibility that they come into contact with their adjacent needle tip portions mutually, since they are located apart from one another by the corresponding thickness of the insulating coating layer. It is acceptable that the needle portion is subjected to an insulating coating treatment with the exception of a contact portion thereof with electrodes or patterns. Further, it is acceptable that the needle portion is not subjected to an insulating coating treatment partially with respect to a portion which is not in danger of contact with the adjacent needle tip portion.

DESCRIPTION OF THE PREFERRED EMBODIMENTS

Hereinafter, there will be described related technology and embodiments of the present invention in conjunction with the accompanying drawings.

At first, the background arts will be described.

Figure 11:
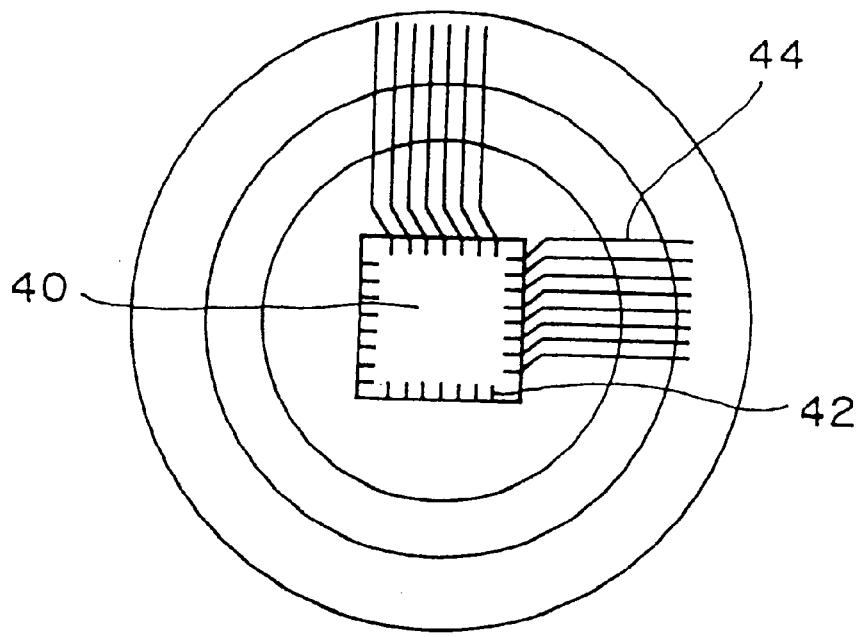
FIG. 11 is an upper view of an integrated circuit.

A high-integrated circuit 40 having an array of a number of microscopic terminals 42 is provided in FIG. 11, where probe pins 44 are arranged in contact with the the terminals 42 respectively. In up-to-date technology, pitch intervals of the terminals 42 have been made smaller and smaller than each 60 μm or below.

Figure 12:
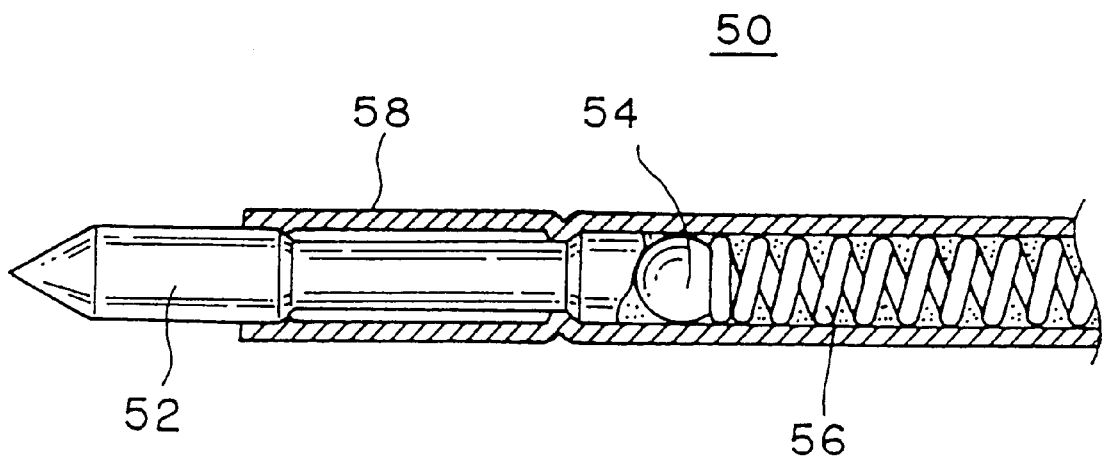
FIG. 12 illustrates a sectional view of a conventional contact probe.

A conventional contact probe 50 is shown in FIG. 12. A contact needle 52 followed by a ball 54 and a spring 56 is covered with a sheath 58, allowing the contact needle be movable to-and-fro along the sheath axis direction. While a minimum outside diameter of the spring 56 may-be 100 μm φ or below, the size of the ball may not be smaller than 200 μm φ in diameter so far, where the outside diameter of the sheath has to be larger, for instance 300 μm.

Figure 13:
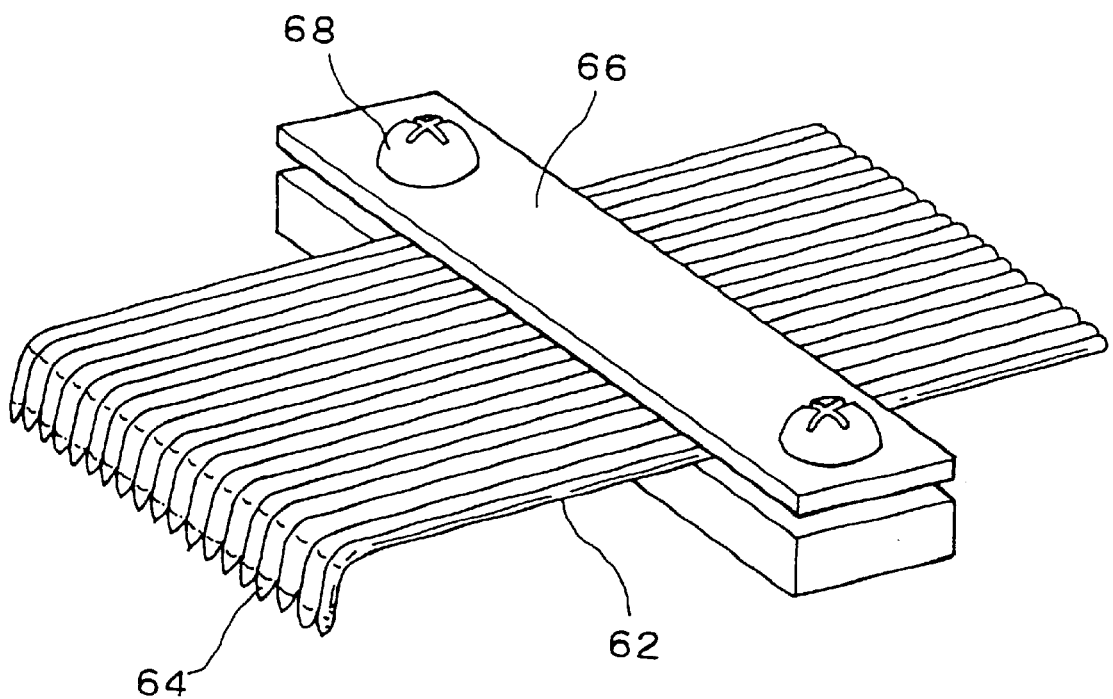
FIG. 13 is a perspective view of a conventional multi-pin probe.

To comply with terminals of the above mentioned high-integrated circuit 40, a parallel multi-pin probe unit 60 as shown in FIG. 13 has been developed.

Figure 14:
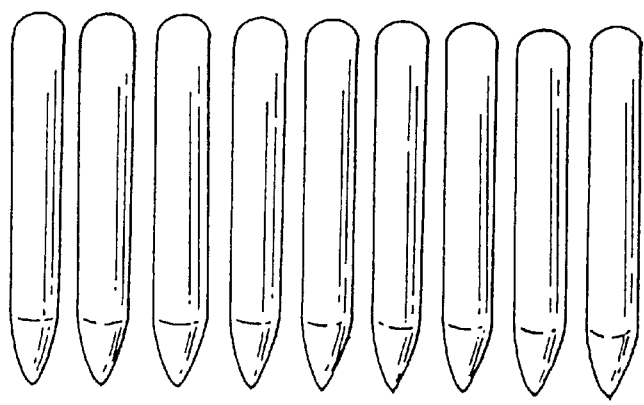
FIG. 14 shows the front view of a part of FIG. 13.

A number of individual probes 62 with elastically movable bent needles 64 are arranged in series as a plate with a binding strip 66 fastened with rivets 68. The front view of the needles 64 is seen in FIG. 14. The pitch between the contiguous needles may not be narrowed less than the diameter of each probe pin, for instance 160 μm.

Next, there will be explained embodiments of the present invention in conjunction with drawings.

Figure 1:
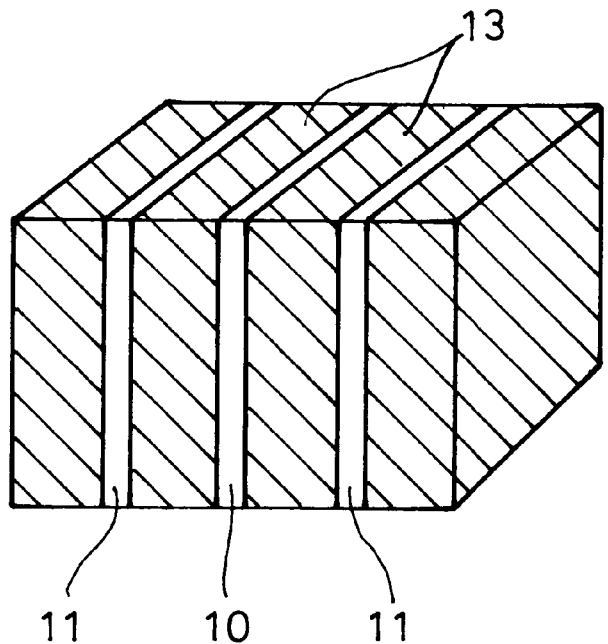
FIG. 1 is a perspective view of a strip line type of probe according to an embodiment of the present invention.

FIG. 1 is a perspective view of a strip line type of probe according to an embodiment of the present invention. According to the present embodiment, a metallic thin plate-like shaped probe 10 is sandwiched between two thin plate-like grounds 11 through respective dielectrics 13. This is an example in which the probe 10 and a contact surface of the grounds 11 with an object to be measured are formed in the same plane as the dielectrics 13. Incidentally, the thickness of each of the dielectrics 13 and the width (the size b show in FIG. 7) of the probe 10 are set up to sizes suitable for the use in high frequency region.

Since the probe 10 is sandwiched between two thin plate-like grounds 11 through the respective dielectrics 13, there is formed a transmission path for high frequency between the two grounds 11.

It is acceptable that the dielectric 13 may be of air, alternatively the dielectric 13 of the tip portion of the probe or the ground is of air and the base of the probe is of a film or a plate made of resin or the like for the purpose of holding the adjacent probe and the ground.

It is acceptable that the dielectric 13 is a plane-like shaped one as far as it can hold the probe 10 and the ground 11, for example, a wave plate-like shaped film.

A laminated contact probe can be implemented by means of laminating a number of probes 10 each sandwiched by a pair of grounds 11 through the respective dielectrics 13. To implement a laminated contact probe of fine pitch, it is recommended that the thickness of the thin plate of the probe 10 and the ground 11 is 0.2 mm (200 μm) or below, and preferably 0.12 mm (120 μm) or below.

It is preferable that such a thin plate is made of steels, copper alloys, tungsten, or quench-hardened steel strips. When the thin plate is made of such materials, it is possible to readily form an ultra-thin plate having the thickness 0.02 mm (20 μm).

Figure 2:
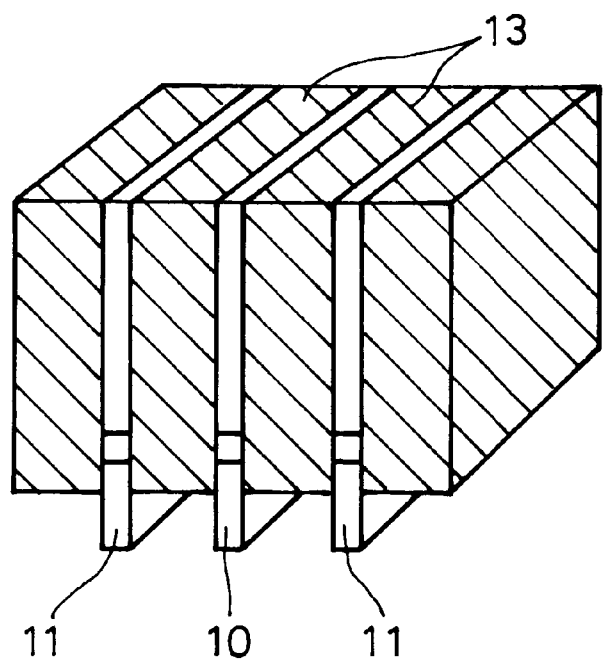
FIG. 2 is a perspective view showing an alternative embodiment of the present invention.

FIG. 2 is a perspective view showing an alternative embodiment of the present invention. This is an example in which tip needle portions of the probe 10 and the grounds 11, which are made of thin plates each having springiness, respectively, project somewhat from the dielectrics 13, and contact surfaces of the probe 10 and the grounds 11 with an object to be measured are formed with the same plane. According to such a structure, since the needle portions of the probe 10 and the grounds 11 are permitted to freely elastically wind horizontally and vertically regardless of an arrangement of the ground of the circuit to be measured, it is possible to readily connect the grounds 11 of the probe with the ground of the circuit.

Further, according to the present embodiment, since the contact surface of the probe 10 is formed with the same plane as the grounds 11, it is possible to reduce an amount of entry of noises generated in the probe 10.

Since the probe 10 is made of a thin plate having a springiness, it is possible to elastically bend when the probe 10 is in contact with probes or patterns of a circuit to be measured. This feature makes it possible to inspect the circuit without hindrance even if the probes or the patterns are arranged as an unevenness on the circuit.

Each of FIGS. 4–8 is a side elevation of a contact probe 10 or a ground 11 according to an embodiment of the present invention.

Figure 4:
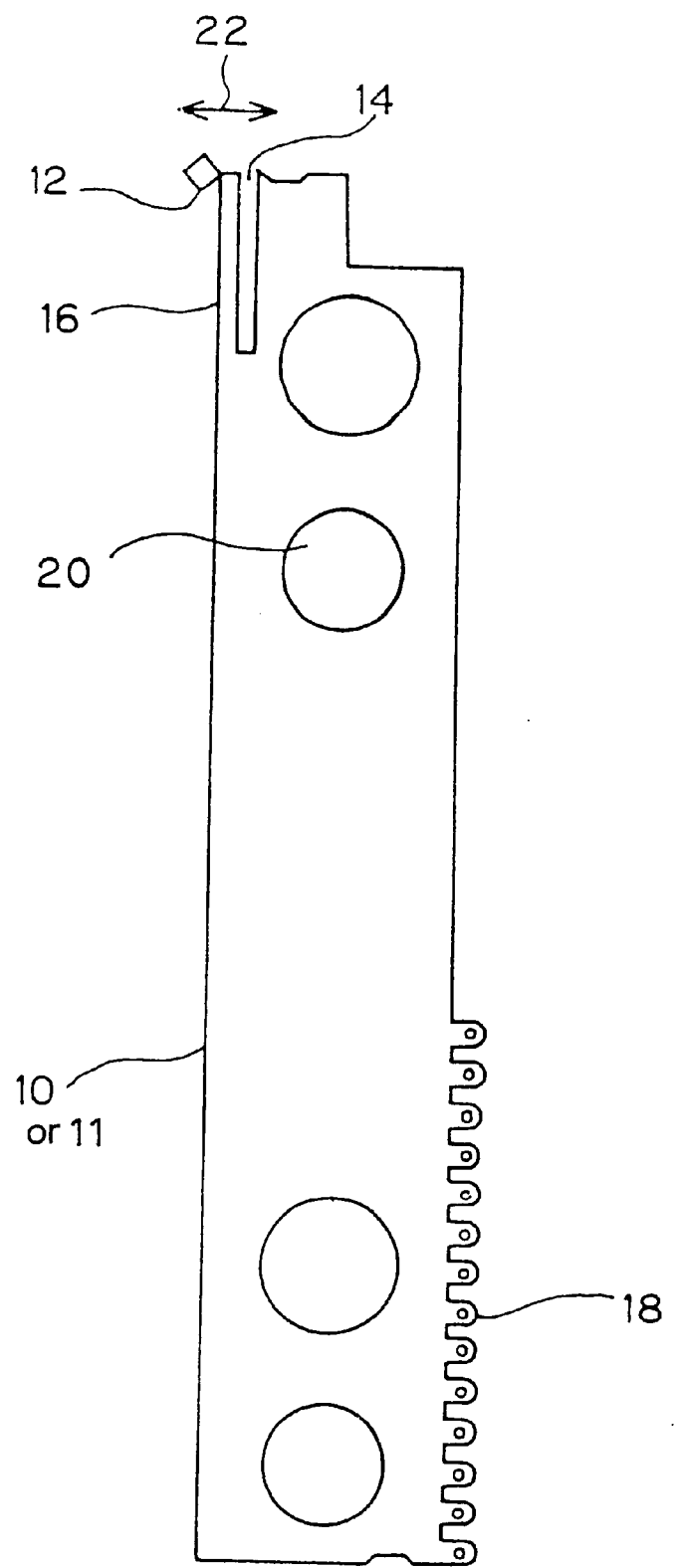
FIG. 4 is a side elevation of a contact probe or a ground according to one embodiment of the present invention.
Figure 8:
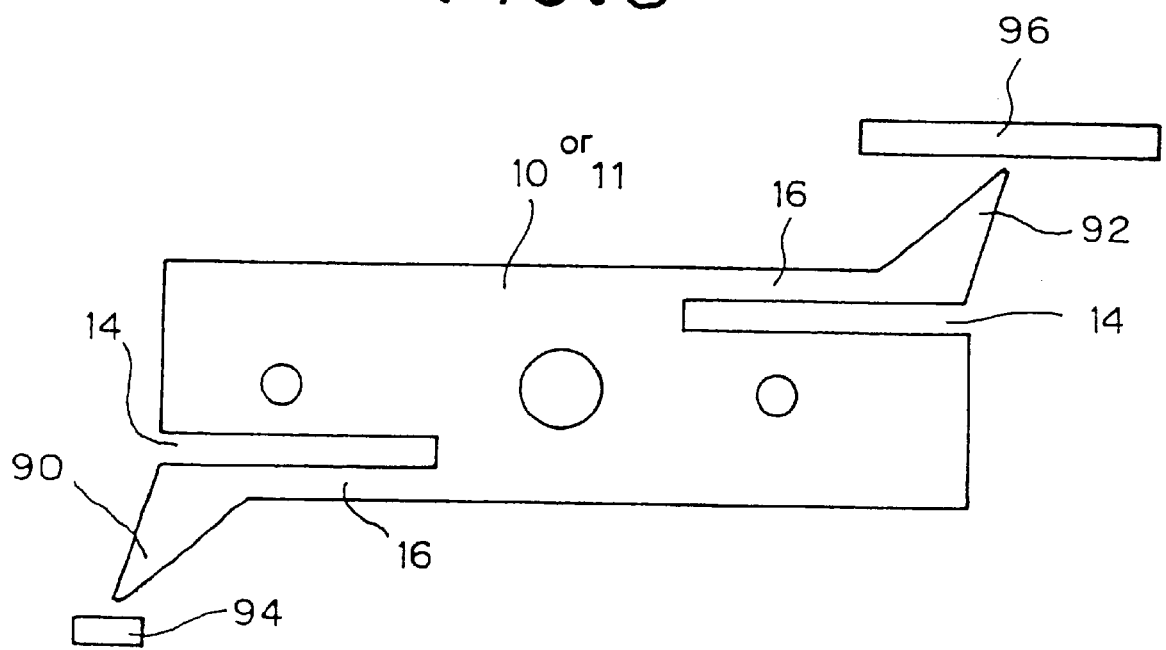
FIG. 8 is a side elevation of a contact probe according to still further another embodiment of the present invention.

As shown in FIG. 8, a cut 14 is formed backward a tip needle portion 90. Hence, the tip needle portion 90 is movable on an elastic basis in a vertical direction with respect to FIG. 8. On the other hand, a substrate connecting terminal portion 92 is formed in a similar fashion to that of the tip needle portion 90. Such an arrangement of the substrate connecting terminal portion 92 makes it possible to directly connect with a substrate 96 on an elastic contact basis without the use of lead wires. As shown in FIG. 4, however, it is of course acceptable that a terminal portion 18 for lead wire connecting is formed, and the terminal portion 18 is connected with the substrate through lead wires.

Selecting a length (or depth) of the cut 14 makes it possible to set up to a desired value an elastic force (spring force) in an elastic traveling of the tip needle portion. Further, selecting a width of the cut 14 makes it possible to control a stroke in an elastic traveling of the tip needle portion.

Figure 5:
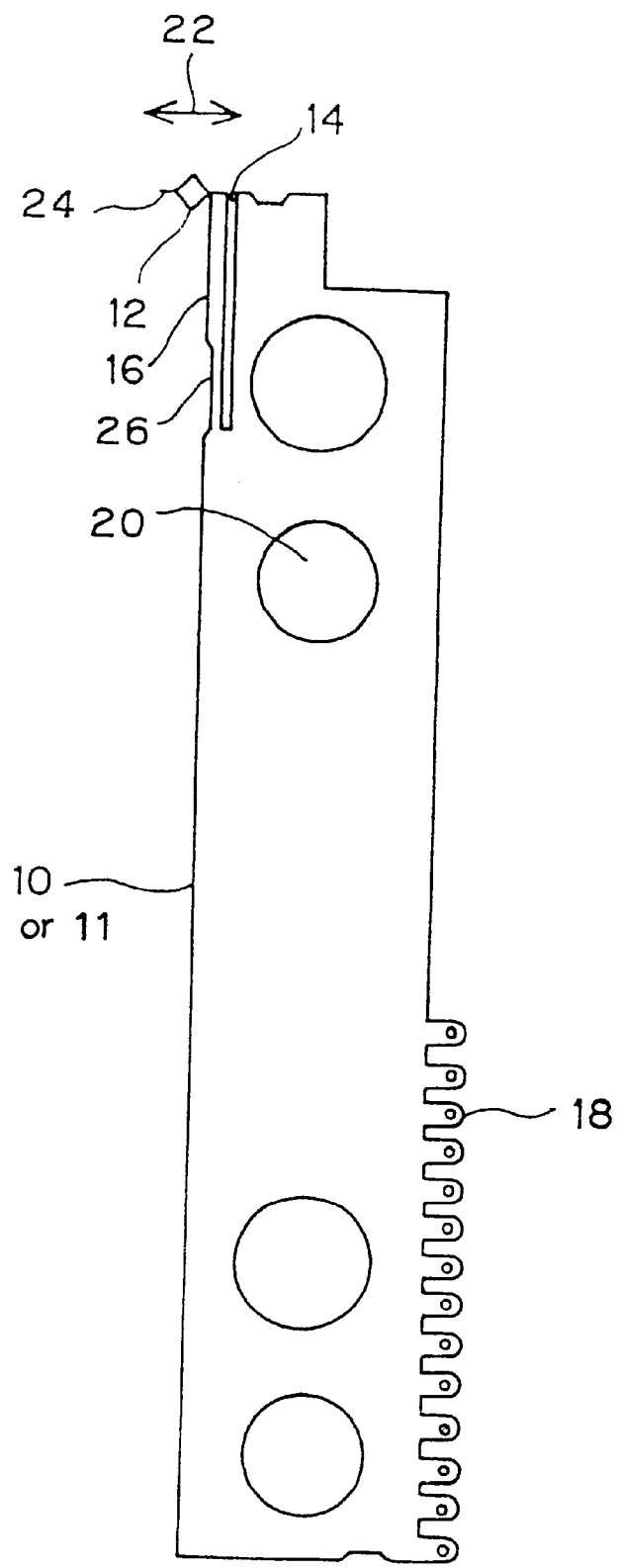
FIG. 5 is a side elevation of a contact probe or a ground according to another embodiment of the present invention.

According to the embodiments shown in FIGS. 4 and 5, the probe 10 or the ground 11 is provided with four apertures 20. Laminating guide pins are inserted into the four apertures 20, respectively, so that the grounds 11 and the probes 10 are alternatively laminated through thin plate-like shaped dielectrics 13 each having the similar four apertures, and both the edges of the guide pins are fixed on a frame body for accommodating the laminated probe. In this manner, it is possible to implement an contact probe in which a number of probes 10 are arranged.

Figure 6:
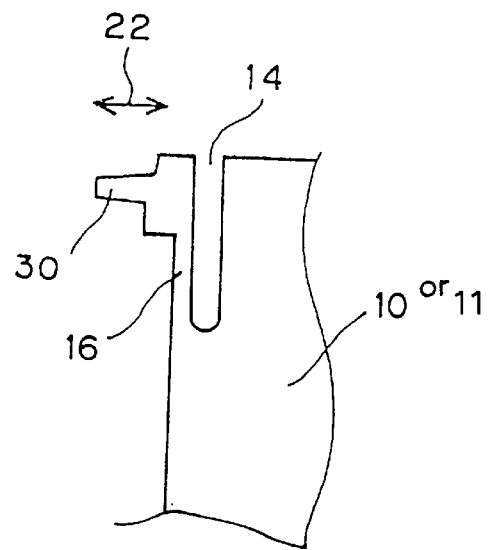
FIG. 6 is a segmentary view of further another embodiment of the present invention.
Figure 7:
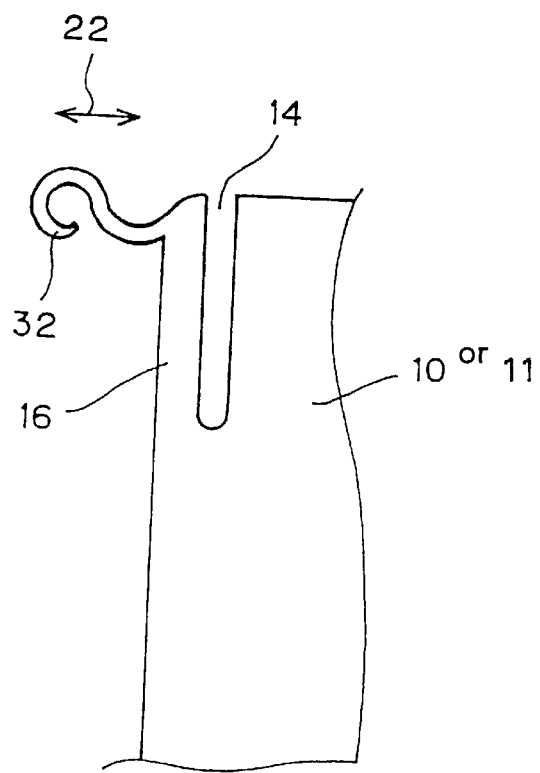
FIG. 7 is a segmentary view of still further another embodiment of the present invention.

According to the embodiments shown in FIGS. 4, 5 and 8, while the tip needle portion is formed with a sharp configuration, it is acceptable that, as shown in FIG. 6, the tip needle portion is formed on the tip with an elongated projection, alternatively, as shown in FIG. 7, the tip needle portion is formed approximately as an alphabetical letter S.

Figure 3:
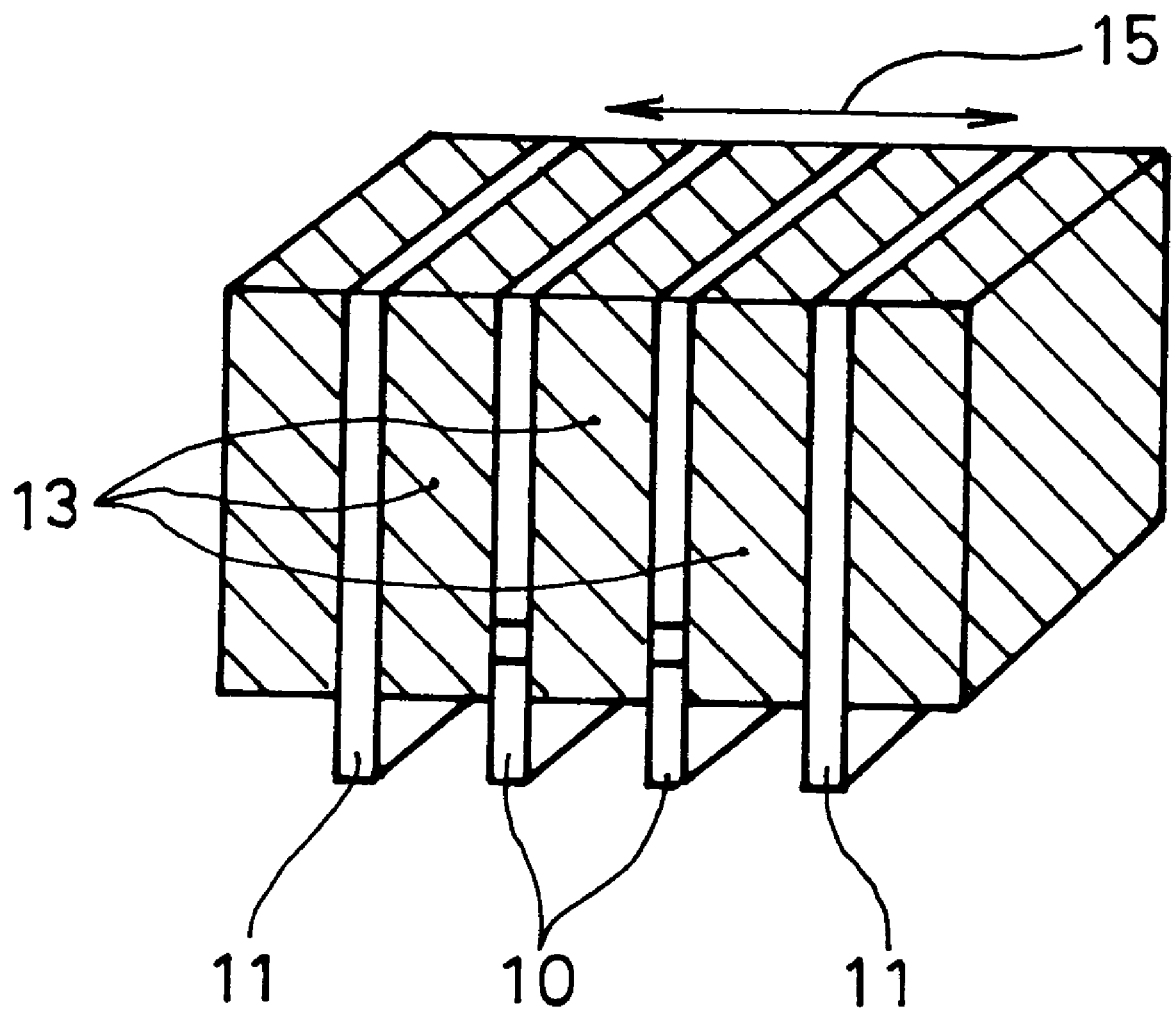
FIG. 3 is a perspective view showing a further alternative embodiment of the present invention.

FIG. 3 is a perspective view showing a further alternative embodiment of the present invention. This is an example in which a plurality of probes 10 are arranged between the grounds 11 through dielectrics 13, and the dielectric 13 is interposed between the probes 10.

According to the strip line type of probe shown in FIGS. 1 and 2, while a single probe 10 is interposed between the grounds 11, in the embodiment shown in FIG. 3, a plurality of probes are arranged.

According to an arrangement of a plurality of probes as shown in FIG. 3, even if pitches of the object to be measured are narrowed, it is permitted to broaden a width of the strip line since a distance between the grounds 11 may be given, and thus it becomes hard to introduce a deterioration of the mechanical performance and also it becomes easy to produce a laminated probe. Further, according to an arrangement of a plurality of probes as shown in FIG. 3, it is permitted to reduce a distance between the probes 10. This feature makes it possible to easily arrange a contact probe associated with fine pitches of an object to be measured.

On the other hand, in the event that a plurality of probes are arranged between the grounds 11, it involves the worse isolation as compared with the probes shown in FIGS. 1 and 2.

Figure 10:
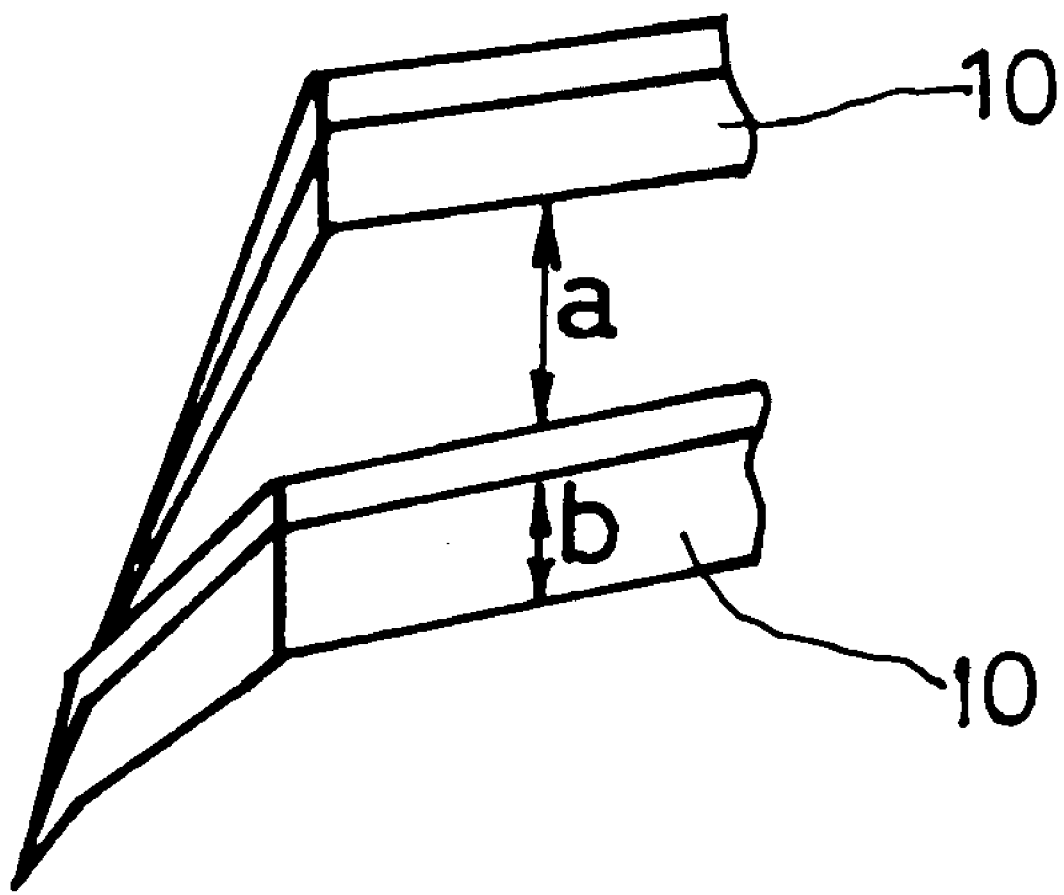
FIG. 10 is a side elevation of the probe shown in FIG. 3.

When the isolation property becomes a problem, it is recommended that a plurality of probes 10 are provided in mutually different configurations and there is provided a difference a as shown in FIG. 10 to vary the probes 10 in their height.

According to the present invention, since the probe is interposed between the grounds through the dielectrics, it is possible to form a high frequency transmission path between the grounds thereby implementing a contact probe for high frequency region.

Further, according to the present invention, since no connector is used, it is possible to readily set up a circuit impedance to a desired characteristic impedance by means of selecting a thickness of the dielectric and a width of the probe (b in FIG. 10).

Further, according to the present invention, since contact surfaces of a plurality of probes 10 and the grounds 11 with an object to be measured are formed with the same plane, it is possible to reduce an amount of entry of noises generated in the probe, and thus to reduce a high frequency loss.

Furthermore, according to the present invention, since it is permitted to form the probes 10 and the grounds 11 with thin plates, respectively, and to set up the dielectric 13 so as to have a minimum thickness requirement, it is possible to readily arrange a fine pitch type of contact probe capable of inspecting a microscopic pitch interval, in case of a laminated contact probe in which a number of probes are arranged.

Next, there will be explained in detail embodiments of the probes or the grounds which are used in the present invention.

A contact probe according to one embodiment of the present invention, as shown in FIG. 4, is made of beryllium copper, given by 50 $\mu$m of thickness of a plate; 5 $\mu$m of an insulating coating (10 $\mu$m in the total of the front and back surfaces); and 100 $\mu$m of a reference stroke.

A large number of such contact probes are laminated in a line to form a laminated contact probe.

With respect to such a laminated contact probe, there were produced three kinds of contact probes (1)–(3), having contact force ranging values as shown in Table 1, given by 20 $\mu$m of a stroke and 60 $\mu$m of a stroke, respectively.

TABLE 1

| Sample No. | Stroke 20 $\mu$m | Stroke 60 $\mu$m |
| --- | --- | --- |
| (1) | 0.8 ~ 1 g | 1.5 ~ 2 g |
| (2) | 1.2 ~ 1.5 g | 2 ~ 2.5 g |
| (3) | 1.5 ~ 2 g | 3 ~ 4 g |

Applicants measured an elastic durability involved in an elastic travel on the above mentioned three kinds of laminated contact probes (1)–(3). As a result, the experiment showed that each of all three kinds of laminated contact probes (1)–(3) is provided with an elastic durability such that those laminated contact probes (1)–(3) withstand one million times of number of shot. On the other hand, the contact probes, which are produced in a similar fashion to that of the above mentioned three kinds of laminated contact probes, except for providing no cut 14, did not withstand the use at twenty thousand times of number of shot.

As mentioned above, according to a laminated contact probe of the present invention, a contact probe is formed into an ultra-thin plate, and a cut is formed backward a needle portion. This feature makes it possible to remarkably improve an elastic durability in an elastic travel of the contact probe. Thus, it is possible to perform a large number of times of inspection for ultra-microscopic high-integrated circuits and the like provided with, for example, 60 μm in pitch interval. Further, according to a laminated contact probe of the present invention, the thin plate is simply laminated. This feature makes it possible to extremely facilitate an assembly and thus to manufacture the products inexpensively.

In accordance with an arrangement shown in FIG. 4, a contact probe 10 is formed into an ultra-thin plate or sheet having a thickness of not more than 60 μmm, and a needle portion 12 is formed into a rhombus-shaped frame. A cut 14 is formed backward the needle portion 12. The needle portion 12 is movable on an elastic basis in the plane of the plate as shown with an arrow mark 22. Reference numeral 18 denotes terminals for connecting lead wires thereto.

Selecting a length (the same as that of the cut 14) of an elongated segment 16 extending from the needle portion 12 makes it possible to set up an elastic force in an elastic traveling of the needle portion 12 to a desired value. Further, selecting a width of the cut 14 makes it possible to control a stroke in an elastic traveling of the tip needle portion 12. In the embodiment shown in FIG. 5, a thickness of the cut 14 is one third as compared with that in FIG. 4.

To implement a further fine adjustment of an elastic force or flexibility of the needle portion 12, it is recommended that as shown in FIG. 5, a recess-like shaped cut portion 26 is formed on the base end of the elongated segment 16. Selection of a length of the cut 14 and a magnitude of the recess-like shaped cut portion 26 makes it possible to implement a desired fine adjustment of an elastic force or flexibility of the needle portion 12.

An insulating coating of a fluororesin is established on the contact probe 10 with the exception of the needle portion 12. It is acceptable that the insulating coating is established throughout the contact probe 10 but an contact portion with an electrode or a pattern of the needle portion 12. Further, it is acceptable to use an insulating material other than the fluororesin, if that is excellent in electric non-conductance.

To establish the insulating coating treatments on the contact probe 10, it is recommended that the contact probe 10 is coated by fine powders of the fluororesin in accordance with vapor deposition schemes or electrostatic coating schemes.

It is preferable that the contact probe 10 is made of steels, copper alloys, tungsten, or quench-hardened steel strips. The use of these materials makes it possible to readily form the contact probe 10 into an ultra-thin plate as 120 μm or below, as far as 20 μm.

Figure 9:
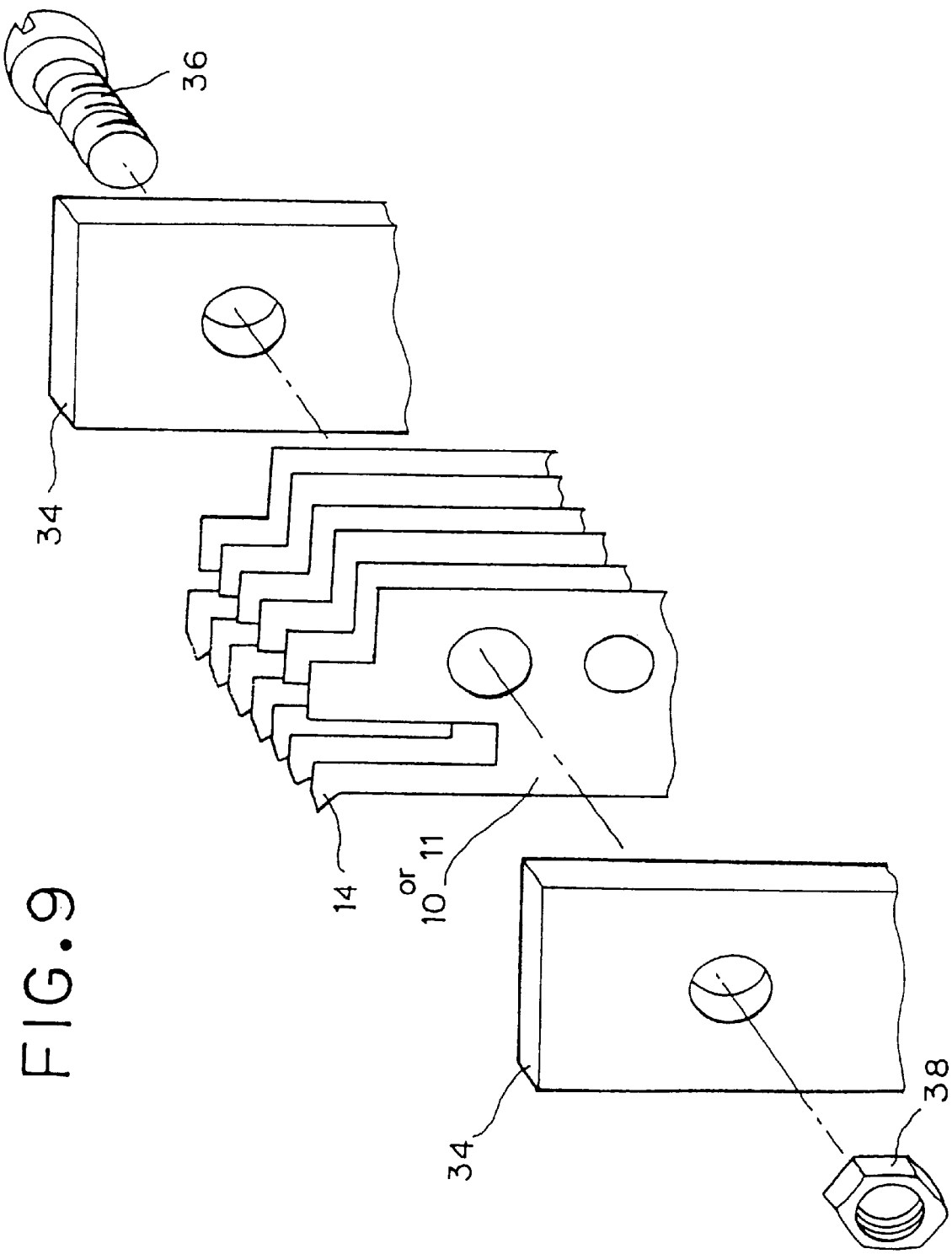
FIG. 9 is a perspective view of the separately shown assembly of the present invention.

The contact probe 10 is provided with four penetration apertures 20 through which laminating guide pins are inserted, respectively. As shown in FIG. 9, the ends of each of the guide pins 36 are to be fixed onto a frame body 34 for accommodating a number of laminated contact probes 10, thereby providing a laminated contact probe assembly according to the present invention. The number of the penetration apertures 20 formed on the contact probe 10 is not restricted. The penetration aperture 20 is not always necessary, since it is sufficient that a large number of contact probes 10 each having the same figure and a thickness of not more than 60 μm are simply laminated in a line.

Usually, the frame body for mounting the contact probe is formed with an insulating material. However, especially, in a case where rigidity is required, it is acceptable to use a metallic material such as special alloys. In this case, even if such a metal is not subjected to an insulating coating treatment, there is no problem, since the contact probe is subjected to an insulating coating treatment.

According to the embodiment shown in FIG. 4, the needle portion 12 is formed into a rhombus-shaped frame. This arrangement improves a flexibility of the contact probe 10, since the needle portion 12 itself may be crooked.

FIG. 6 is a segmentary view of further another embodiment of the present invention. In the tip needle portion, as shown in FIG. 6, a projection 30 is formed on the elongated segment 16.

FIG. 7 is a segmentary view of still further another embodiment of the present invention. In the tip needle portion, as shown in FIG. 7, an S-like shaped projection 32 is formed on the elongated segment 16.

Further, it is acceptable that as shown in FIG. 5, there is provided a projection 24 on the tip of the rhombus-shaped frame.

FIG. 8 shows still further another embodiment of the present invention. A thin metal plate 10 has two contact needles 90 and 92 provided approximately symmetrical each other with respect to the center of the plate, one of which 90 contacts to a device pattern pad 94 to be inspected and the other of which 92 contacts to printed wiring board 96 of a measuring instrument. The first contact needle 90 corresponds to the needle 12 shown in FIG. 4. Reference numerals 14 and 16 are also the same as those shown in FIG. 4. The second contact needle 92 is a substitute of the terminal 18 shown in FIG. 4. The needle 92 may eliminate bonded wires to connect the probe 10 with a measuring instrument. Moving the plate 10 around the central axis perpendicular to the metal plate 10 makes the two contact needles 90 and 92 simultaneously work as precise on-and-off switches.

A contact probe according to the present invention can be used as contacts of electrical components of switches, relays, connectors and the like.

When the contact probe according to the present invention is used as contacts of the electrical components, there are expected many advantages such as a fine pitch, a long life time, a contact capacity being small, a projecting length of the probe being not varied, and etc.

The use of the contacts within a relay makes it possible to implement a compact, long life time, and small contact-capacity of relay, and a combination of such a type of relays makes it possible to arrange a compact of switch matrix and the like.

With respect to the connector, there is adopted such a scheme that a rod-like shaped metal is inserted into a relatively small metallic hole having a slot. According to such a connector, however, an alignment in the insertion is not so easy, and thus this will be an obstacle to automating. Further, according to the connector, the site after an engagement is unstable. This involves such a defect that a projecting length of the probe will be varied.

The foregoing has been solved in accordance with the present invention directed to a contact probe in which a structure of the contact probe is given as a contact portion of the connector.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

I claim:

1. A laminated contact probe for inspection of an ultra-microscopic pitch for high frequency region comprising a plurality of contact probes and ground plates, wherein said contact probes and ground plates are formed with ultra-thin plates; the contact probes are sandwiched with the ground plates provided with dielectrics between the contact probe(s) and the ground plates;

the contact probe has an elongated segment portion extending from a needle portion, said elongated segment portion being provided by forming a cut on the ultra-thin plate backward the needle portion, so that said needle portion is movable on an elastic basis in a direction perpendicularly intersecting to a direction of the cut; and said plurality of contact probes are laminated.

2. A laminated contact probe for inspection of an ultra-microscopic pitch for high frequency region according to claim 1, wherein said ultra-thin plate is made of steels, copper alloys, tungsten, or quench-hardened steel strips.

3. A laminated contact probe for inspection of an ultra-microscopic pitch for high frequency region according to claim 1, wherein a thickness of said ultra-thin plate is 120 $\mu$m or below.

4. A laminated contact probe for inspection of an ultra-microscopic pitch for high frequency region according to claim 1, wherein said laminated contact probe is provided with an aperture through which a guide pin is inserted, and the guide pin is fixed onto a frame body for accommodating the contact probes, so that said laminated contact probe is fixed.

5. A laminated contact probe for inspection of an ultra-microscopic pitch for high frequency region according to claim 1, wherein a recess-like shaped cut portion is formed on a base end of the elongated segment associated with said needle portion so as to adjust an elastic force of the needle portion.

6. A laminated contact probe for inspection of an ultra-microscopic pitch for high frequency region according to claim 1, wherein a plurality of contact probes are laminated through dielectrics, and both sides of the plurality of probes together are sandwiched by ground plates.

7. A laminated contact probe according to claim 6, wherein contact surfaces of the plurality of probes and the grounds with an object to be measured are formed with a same plane.

* * * * *